(12) United States Patent
Rosezin et al.

(10) Patent No.: US 9,001,558 B2
(45) Date of Patent: Apr. 7, 2015

(54) METHOD FOR NONDESTRUCTIVELY READING RESISTIVE MEMORY ELEMENTS

(75) Inventors: Roland Daniel Rosezin, Bernau am Chiemsee (DE); Florian Lentz, Pulheim (DE); Rainer Bruchhaus, Munich (DE); Eike Linn, Wuerselen (DE); Ilia Valov, Aachen (DE); Rainer Waser, Aachen (DE); Stefan Tappertzhofen, Aachen (DE); Lutz Nielen, Aachen (DE)

(73) Assignees: Forschungszentrum Juelich GmbH, Juelich (DE); Rheinisch-Westfaelische Technische Hochschule Aachen (RWTH), Aachen (DE)

( * ) Notice: Subject to any disclaimer, the term of this patent is extended or adjusted under 35 U.S.C. 154(b) by 0 days.

(21) Appl. No.: 14/000,285

(22) PCT Filed: Feb. 3, 2012

(86) PCT No.: PCT/DE2012/000096
§ 371 (c)(1),
(2), (4) Date: Oct. 22, 2013

(87) PCT Pub. No.: WO2012/113365
PCT Pub. Date: Aug. 30, 2012

(65) Prior Publication Data
US 2014/0036574 A1      Feb. 6, 2014

(30) Foreign Application Priority Data
Feb. 24, 2011   (DE) .................. 10 2011 012 738

(51) Int. Cl.
*G11C 11/00*    (2006.01)
*G11C 13/00*    (2006.01)

(52) U.S. Cl.
CPC .......... *G11C 13/004* (2013.01); *G11C 13/0007* (2013.01); *G11C 13/0061* (2013.01); *G11C 2013/0073* (2013.01); *G11C 2213/73* (2013.01); *G11C 2213/76* (2013.01)

(58) Field of Classification Search
USPC ............. 365/46, 94, 100, 129, 148, 158, 163; 257/2–5, 9, 310, E21.35; 438/95, 96, 438/135, 166, 240, 365, 482, 486, 597, 785
See application file for complete search history.

(56) References Cited

U.S. PATENT DOCUMENTS 5,729,488 A     3/1998  Drab et al.
7,505,334 B1 *  3/2009  Breitwisch et al. ...... 365/189.15
(Continued)

FOREIGN PATENT DOCUMENTS

DE   10 2009 023 153    12/2010
JP   7-014380            1/1995

OTHER PUBLICATIONS

Mustafa J et al: "Capacitive-resistive nondriven plateline cell architecture for RRAM technology", AEU International Journal of Electronics and Communications, Elsevier, Jena, DE, vol. 60, No. 6, Jun. 1, 2006, pp. 459-461, XP028043128, ISSN: 1434-8411, DOI: 10.1016/J.AEUE.2005.09.005 [retrieved on Jun. 1, 2006] p. 461, left-hand column, paragraphs 2, 3—right-hand column, paragraph 1: figures 6, 7.

(Continued)

*Primary Examiner* — Harry W Byrne
(74) *Attorney, Agent, or Firm* — Jordan and Hamburg LLP

(57) ABSTRACT

A method for reading out a memory element comprises a series connection. of at least two memory cells A and B each have a stable state A0 or B0 having higher resistance and a stable state A1 or B1 having lower electrical resistance. An electrical variable of the series circuit is measured and an electrical variable is selected for this measurement, to which the memory cell A in state A0 makes a different contribution than the memory cell B in state B0 and/or to which the memory cell A instate A1 makes a different contribution than the memory cell B in state B1. The two state combinations A1 and B0 or A0 and B1 then result in differing values for the electrical variable that is measured by way of the series circuit. These state combinations can thus be distinguished from each other without having to change the logic state of the memory element during reading.

12 Claims, 5 Drawing Sheets

(56) References Cited

U.S. PATENT DOCUMENTS

| | | |
|---|---|---|
| 2006/0002174 A1* | 1/2006 | Hosoi et al. .................... 365/148 |
| 2006/0023497 A1* | 2/2006 | Kawazoe et al. ............. 365/158 |
| 2008/0158967 A1* | 7/2008 | Mokhlesi et al. ......... 365/185.17 |
| 2008/0158983 A1* | 7/2008 | Mokhlesi et al. ......... 365/185.21 |
| 2011/0038199 A1* | 2/2011 | Breitwisch et al. ........... 365/163 |

OTHER PUBLICATIONS

Carsten Kügeler et al: "Materials, technologies, and circuit concepts for a nanocrossbar-based bipolar RRAM", Applied Physics A; Materials Science & Processing, Springer, Berlin, DE, vol. 102, No. 4, Jan, 29, 2011, pp. 791-809, XP019890023, ISSN: 1432-0630, DOI: 10.1007/S00339-011-6287-2 p. 805-p. 807; figures 27, 28; table I.

* cited by examiner

METHOD FOR NONDESTRUCTIVELY READING RESISTIVE MEMORY ELEMENTS

The invention relates to a method for non-destructively reading out resisistive memory elements.

PRIOR ART

Resistive memories are characterized by having a very simple design. For a particular minimal feature size F, these can be implemented on an area of $4F^2$. Conventional resistive memory cells have a stable state 0 having higher electrical resistance and a stable state 1 having lower electrical resistance. The disadvantage is that, in addition to the direct current path through the respective addressed memory cell, parasitic current paths form through further memory cells in a memory matrix comprising many of these memory cells. The configuration of these parasitic current paths is additionally dependent on the bit pattern stored in the memory matrix.

BACKGROUND OF THE INVENTION

A memory element is known from DE 10 2009 023 153, in which a memory cell A having stable states A0 and A1 is connected in series to a memory cell B having stable states B0 and B1. In this memory element, state 0 can be coded in the combination of states A1 and B0, and state 1 can be coded in the combination of states A0 and B1. This memory element has high resistance, both in state 0 and in state 1, so that the element acts as a high-resistance resistor in each parasitic current path. These memory elements can be used to implement considerably larger storage matrices than with conventional memory cells.

The trade-off for this advantage is that, after reading out a state 1, the memory cell A is switched to state A1 and the memory cell B is switched to state B0, and the information written to the cells is thereby lost. The memory element does not automatically return from this state to the state that was present prior to the read-out. The read-out of state 1 is therefore destructive. So as to restore the original state, state 1 must again be written to the memory element.

Therefore, it is the object of the invention to provide a method by way of which memory elements of the type described in DE 10 2009 023 153 can be read out non-destructively. It is a further object of the invention to provide a memory element that is particularly suited for carrying out this method.

These objects are achieved according to the invention by a method according to the main claim and by a memory element according to the additional independent claim. Further advantageous embodiments will be apparent from the respective dependent claims.

Subject Matter of the Invention

Within the context of the invention, a method for reading out a memory element, which comprises a series connection of at least two memory cells A and B, was developed. The memory cells A and B each have a respective stable state A0 or B0 having higher resistance and a respective stable state A1 or B1 having lower electrical resistance. State 0 of the memory element is coded in the combination of states A1 and B0; state 1 of the memory element is coded in the combination of states A0 and B1. In the method, an electrical variable of the series circuit is measured.

According to the invention, an electrical variable is selected for this measurement, to which the memory cell A in state A0 makes a different contribution than the memory cell B in state B0 and/or to which the memory cell A in state A1 makes a different contribution than the memory cell B in state B1.

It was recognized that the two state combinations A1 and B0, or A0 and B1, then result in different values for the electrical variable measured by way of the series circuit. By way of this measurement, states 0 and 1 of the memory element can thus be distinguished from each other, without having to change the overall state of the memory element.

In a particularly advantageous embodiment of the method, none of the memory cells is thus switched to a different state during the read-out. Reading out thus becomes non-destructive. This saves the additional time and energy that was required according to the prior art in writing read-out 1 to the memory element again after reading out a state 1. Moreover, this advantageously increases the service life of the memory element. At the microscopic level, the switching of memory cells is not entirely reversible, so that memory cells progressively degrade as the number of write cycles increases. Because reading is now non-destructive, write cycles are reduced. Memory elements are generally read out much more frequently than written to, so that they can now be used for much longer periods due to the method according to the invention.

In a particularly advantageous embodiment of the invention, a voltage generated by the memory element is selected as the electrical variable that is measured. It was recognized that there are classes of memory cells that generate low electrochemical voltage in the state of high electrical resistance.

Such a class comprises memory cells having two electrodes made of differing metals, for example Cu and Pt, between which an electrolyte, for example GeSe or methylsilsequioxane (MSQ), is disposed. Because the metals have differing redox potentials, one material has a higher tendency of releasing ions into the electrolyte than the other. This creates a difference in potential, and thus a voltage between the two electrodes.

Another class comprises memory cells having two metallic electrodes and an electrolyte disposed between these, wherein the electrolyte has differing ion concentrations at the interfaces with the two electrodes. For example, the ion concentration, such as the concentration of oxygen ions, in the electrolyte may have a gradient from one electrode to the other electrode. Even if the metals of the two electrodes are identical, they then have differing tendencies of releasing ions into the electrolyte. This also results in a difference in potential between two electrodes of these memory cells, the difference being measurable as a voltage.

Typical values of the voltage generated by a memory cell are approximately 50 mV.

However, this voltage can only be measured if the memory cell is in the high-resistance state (A0 or B0). If the cell is in the low-resistance state (A1 or B1), the difference in potential is shunted directly by the memory cell, so that the same no longer supplies a measurable contribution to the overall voltage that is generated in the memory element. According to the findings of the inventors, this shunt is achieved by microscopic electrically conductive paths, which form through the electrolyte during the switching into state A1 or B1. Such a path may break down spontaneously under adverse conditions, such as a high temperature. The memory cell then switches into state A0 or B0, and at the same time the difference in potential between the two electrodes returns.

If the potential difference is shunted directly by the memory cell, no current flows, and the memory cell therefore also does not experience any electrochemical change. In contrast, if the memory cell is shunted externally, electrons are transported through the external load, as with a battery, while ions are transported in the memory cell itself. The electrode materials in the memory cell are thus electrochemically degraded. Over time, not only does the voltage generated by the memory cell decrease, the memory cell also progressively loses its primary function.

If the two memory cells A and B generate, for example, differing voltages in the states A0 and B0 thereof, it can be established by measuring the voltage that is generated in the series circuit composed of the memory cells A and B whether memory cell A is in state A0 or whether memory cell B is in state B0. For this purpose, the memory cells A and B do not even have to be manufactured differently. If these are interconnected antiserially, they feed the voltages thereof in state A0 or B0 with different polarities into the series circuit. The polarity of the voltage measured at the memory element then supplies the information as to which of the memory cells has high resistance. In keeping with the operating principle of the memory element, this establishes whether the memory element is in state 0 or 1.

In a further particularly advantageous embodiment of the invention, the capacitance of the memory element is selected as the electrical variable that is measured. It was recognized that the memory cells A and B can be produced so that they have differing capacitances, while they may be identical in terms of the resistive switching behaviors thereof. Specifically if two such memory cells A and B are interconnected antiserially, the IV characteristic of the memory element composed of these memory cells remains symmetrical, while the two memory cells A and B can be distinguished from each other by the differing contributions to the overall capacitance of the memory element.

As with the voltage generated by a memory cell, the capacitance thereof is also effective on a noteworthy scale only in the high-resistance state A0 or B0. In the low-resistance state (A1 or B1), microscopic, electrically conductive paths (filaments) exist between the two electrodes of the memory cell, which act as capacitor plates forming the capacitance. In each of the two states 0 or 1 of the memory element, thus only the capacitance of one of the two memory cells (A or B) is decisive for the measured overall capacitance of the memory element.

So as to measure the capacitance, the time constant with which the overall capacitance of the memory element is charged or discharged is advantageously evaluated. To this end, the overall capacitance C and overall resistance R of the memory are viewed as an RC circuit, The time constant thereof includes only the product of R and C. If the two memory cells A and B forming the memory element have nominally identical resistance values, the memory element as a whole, both in the state 0 thereof and in the state 1 thereof, has the same known overall resistance R, because this is composed in both states of a high-resistance memory cell and a low-resistance memory cell.

For example, the time constant can be evaluated by analyzing the current response when a DC voltage is applied to the memory element. For this purpose, the time characteristic of the current, which is driven through the memory element after a DC voltage has been applied to the memory element, is measured, for example as a voltage drop across a resistor that is connected in series with the memory element. The current depends on the charge state of the overall capacitance of the memory element. Initially, after the DC voltage has been activated, the current is high and exponentially decays with the time constant of the RC circuit to a constant value, which is defined by the resistance of the memory element. This resistance is generally highly resistive, both in state 0 and in state 1 of the memory element.

The two memory cells A and B of the memory element can each be regarded as a parallel circuit of the resistance and the capacitance of the respective memory cell. Because the resistance of the memory cell is provided by the active material between the electrodes, which acts as a dielectric of the capacitor, the resistance does not act as a charging resistance for the capacitance of the memory cell. A charge can be deposited on the electrodes without having to pass through the active material. The active material rather acts as a discharging resistance for the capacitance. The lower this resistance, the faster electrons flow from the more negative electrode through the active material to the more positive electrode and equalize the potential difference between the two electrodes. If the memory cell in state A1 or B1 has a sufficiently small resistance, charges will no longer accumulate on the electrodes of the memory cell, but will be transported from one electrode to the other directly through the active material. The capacitance of the memory cell in state A1 or B1 is then, de facto, no longer effective, so that the overall capacitance of the memory element is determined by the respective other memory cell, which is in state B0 or A0.

Because in each memory element one of he memory cells A or B is always in state A0 or B0, the capacitance of one of the two memory cells is always effective. In a memory matrix comprising many memory cells, the capacitances of the non-addressed memory elements thus act as parasitic capacitances and reduce the accuracy of the measurement as the number of memory elements increases.

In a further particularly advantageous embodiment of the invention, measurement is made of the time characteristic of the potential, which is present between the memory element and a further capacitance after a DC voltage has been applied to a series circuit comprising the memory element and a further capacitance.

It was recognized that the memory element and the further capacitance then form a capacitive voltage divider. The potential that develops at the pick-up point between the memory element and the further capacitance depends on the capacitance of the memory element. Based on the description above, depending on the state of the memory element (0 or 1), this capacitance is defined by the capacitance of one of the two memory cells A or B because the capacitance of the low-resistance memory cell is, de facto, not effective. The measured potential therefore depends on the state of the memory element.

It was recognized that the effect of the capacitance of non-addressed memory cells on the measured potential decreases the greater the further capacitance is. The further capacitance represses the influence of non-addressed memory elements. The critical variable of a memory matrix at which the potential caused by the addressed memory element can no longer be reliably distinguished from the potential caused by non-addressed memory elements can thus be increased by raising the further capacitance. On the other hand, however. the absolute value (voltage swing) by which the measured potential differs between states 0 and 1 of the memory elements decreases with rising further capacitance.

The further capacitance can be an external capacitance that is connected in series with the memory element and is connected between a bit line and ground, for example. Depending on the circuit design of a memory matrix in which the memory element is included, however, the existing capacitances, such as the capacitances of metallic wires, can act as the further capacitance and suppress the contribution of non-addressed memory elements.

Because the memory element is connected to ground only by way of the series circuit with the further capacitance, current does not flow through the element continuously after the DC voltage has been applied. Only the amount of charge that is required to fully charge the further capacitance flows through the memory element. This further capacitance then blocks any further flow of current to ground. However, as the flow of current disappears, so does the voltage drop across the two memory cells of the memory element; this drop had been caused by the current flow through the resistive active material. The pick-up point at which the potential is measured thus takes on the supply voltage as soon as the further capacitance is fully charged. The state of the memory element can therefore be read out by way of the potential between the memory element and the further capacitance only while this further capacitance is being charged. The time available for this is defined by the magnitude of the further capacitance and the current driven through the memory element.

The circuit design in which the memory element is connected to ground only by way of the series circuit with the further capacitance is generally only suited for reading out the memory element. So as to switch the state of the memory element, it is not only necessary to apply a write voltage, but also to drive current through the memory element for a sufficient duration. For this purpose, either the further capacitance must be very large, or the memory element must be connected to ground without the interposed further capacitance.

As an alternative, or in combination with capacitance measurement by way of application of a DC voltage, the drop of an AC voltage across the memory element may be measured. In terms of AC impedance, the memory element, together with the inherently present parasitic capacitances, then forms a capacitive voltage divider. Measurement by way of AC voltage has the advantage that the voltage drop is constantly present and does not disappear a short time after the voltage has been applied.

The degree to which the capacitances of the memory cells A and B differ from each other is established by the geometries thereof when they are produced. The memory cells are plate capacitors in a first approximation, the plates of which are the metallic electrodes and the dielectric of which is formed by the active storage medium. The invention thus also relates to a memory element having at least one first stable state 0 and a second stable state 1, which can be transferred into state 0 by the application of a first write voltage $V_0$ and into state 1 by the application of a second write voltage $V_1$, wherein the two states 0 and 1 are manifested in differing electrical resistance values of the memory element when a read-out voltage $V_R$ is applied, the absolute value of which is less than the write voltages $V_0$ and $V_1$. The memory element comprises a series connection of at least two memory cells A and B for this purpose, each having a stable state A0 or B0 having higher electrical resistance and a stable state A1 or B1 having lower electrical resistance. According to the invention, the capacitances of the memory cells A and B differ by at least 10%, preferably by at least 15%, and particularly preferably by at least 20%, from each other in the state combination A0 and B0 and/or in the state combination A1 and B1.

Based on the description above, such a memory element has the advantage that it is possible to establish which of the two memory cells is in state A1 or B1, by measuring the overall capacitance. If state 0 of the memory element is coded in the combination of states A1 and B0, and if state 1 of the memory element is coded in the combination of states A0 and B1, it can be established by measuring the overall capacitance whether the memory element is in state 0 or in state 1.

So as to implement a memory matrix comprising many memory elements, it is desirable for the capacitance of an individual memory element to be small in both states 0 and 1. The further capacitance that is provided according to the invention can reliably suppress the influence of non-addressed memory elements only if the further capacitance is high as compared to the overall capacitance of all parasitic current paths through non-addressed memory elements. All parasitic current paths that are possible between a particular word line and a particular bit line are connected in parallel, so that the capacitances thereof add up.

In a further particularly advantageous embodiment of the invention, the memory element is designed as a stack comprising a first metallic electrode, a first layer of active material having variable electrical resistance, a second metallic electrode, a further layer of active material having variable electrical resistance, and a third metallic electrode. In a first approximation, this can be regarded as a plate capacitor, wherein the electrodes act as plates and the active material forms the dielectric.

The thicknesses of the two layers of active material advantageously differ by a factor of at least 1.1, preferably by a factor of at least 1.5, and particularly preferably by a factor of at least 2. By way of example, a memory element was implemented as a stack comprising a Pt electrode, an $SiO_2$ layer as the active material of memory cell A, a Cu electrode as the common electrode of both memory cells A and B, a further $SiO_2$ layer as the active material of memory cell B, and a further Pt electrode. The first $SiO_2$ layer had a thickness of 10 nm, and the second SiO layer had a thickness of 20 nm. Memory cell B thus had twice the capacitance of memory cell A.

The relative permittivities of the two layers of active material advantageously differ by a factor of at least 1.1, preferably by a factor of at least 2, and particularly preferably by a factor of at least 5. By way of example, a memory element was implemented as a stack comprising a Pt electrode, an $SiO_2$ layer as the active material of memory cell A, a Cu electrode as the common electrode of both memory cells A and B, a $TiO_2$ layer as the active material of memory cell B. and a further Pt electrode. The relative permittivity $\epsilon_R$ of $SiO_2$ is 4; the relative permittivity $\epsilon_R$ of $TiO_2$ is 20. Memory cell B thus had five times the capacitance of memory cell A.

If a voltage generated by the memory element is to be measured as the electrical variable so as to non-destructively read out the memory element, and if the memory element comprises memory cells having two electrodes made of differing metals, between which an electrolyte is disposed, the voltage can be maximized by suitably selecting the materials that are used as the electrodes and electrolyte. The important factor in this design of the memory cells is that the metals of the two electrodes of a memory cell are located as far as possible away from each other in the electrochemical series. However, at the same time it is also required for at least one of the metals to be mobile in the electrolyte in the form of ions, so that these ions can form an electrically conductive path through the electrolyte. Switching of the memory cell into state A1 or B1 having lower electrical resistance is achieved by forming said path.

In the experiments conducted by the inventors, copper and silver were successfully employed as electrode metals, the ions of which are mobile in the electrolyte and which, in each case in conjunction with a considerably more noble or considerably less noble metal as the second electrode, generate a voltage that can be easily measured. Silver, platinum and tungsten are particularly suitable metals for the second electrode in this context. The electrolyte is advantageously a chalcogenide. Chalcogenides include selenides, sulfides and oxides.

The subject matter of the invention will be described hereafter based on figures, without thereby limiting the subject matter of the invention.

DESCRIPTION OF THE PREFERRED EMBODIMENTS

Figure 1:
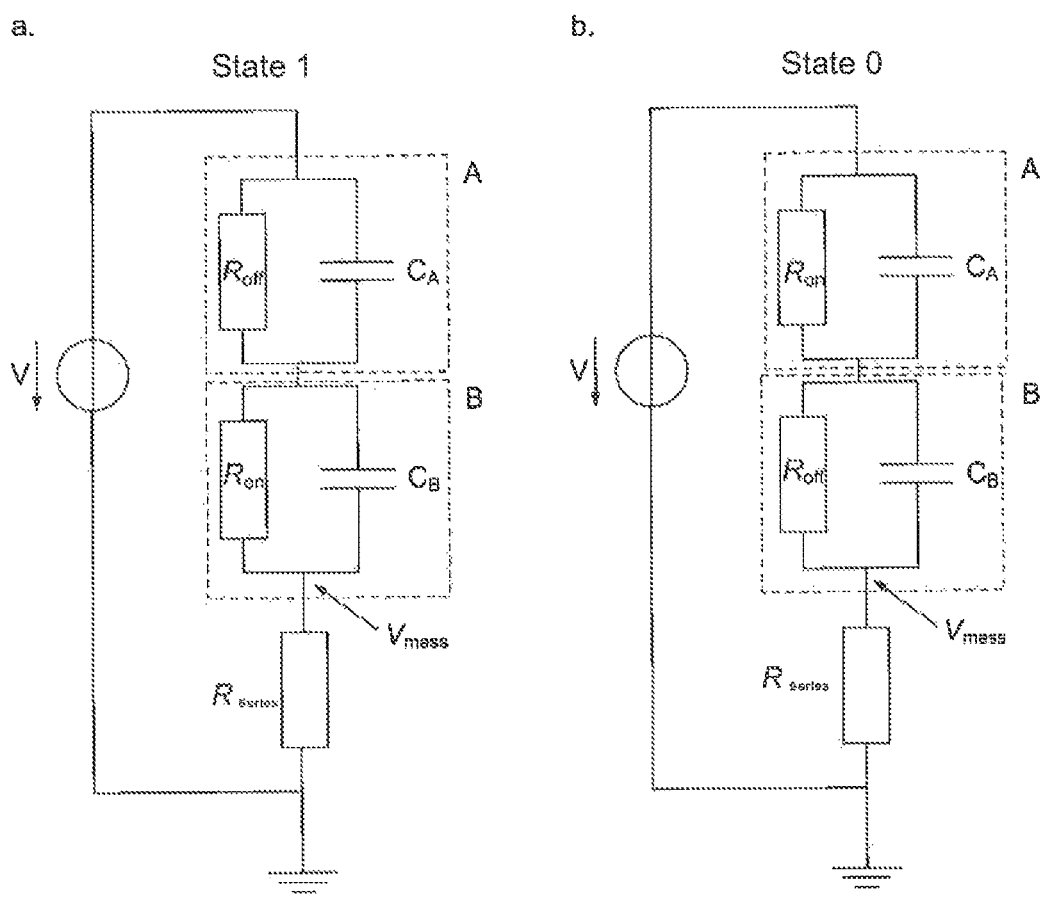
FIG. 1: shows a circuit design for non-destructively reading out a memory element by way of current response using equivalent circuit diagram of the memory element in state 1 and state 0.

FIG. 1 shows the circuit design that can be used to read out a memory element comprising two memory cells having differing capacitances by way of the current response. In partial figure a, the memory element is in state 1 (state combination A0 and B1 in the memory cells). In partial figure b, the memory element is in state 0 (state combination A1 and B0 in the memory cells). The memory element is shown in each case as an equivalent circuit diagram. In state A0 or B0, each of the cells A and B has a resistance $R_{off}$ of 1 MΩ, and in state A1 or B1. each has a resistance $R_{on}$ of 1 kΩ. The square electrodes of memory cell A having an edge length of 1 µm and the active material disposed between them, which has a thickness of 30 nm and relative permittivity of 4 and provides the resistance of memory cell A, form a capacitance $C_A$ of 1.18 fF. The electrodes of memory cell B and the active material disposed between them, which provides the resistance of memory cell B, form a capacitance $C_B$ of 11.8 fF. A resistor $R_{series}$ of 1 MΩ is connected in series with the memory element. The current $I_1$ or $I_0$ flowing through the memory element generates a voltage drop of $V_{mess}$ across this resistor to ground, the voltage drop being evaluated as a measurement signal.

Figure 2:
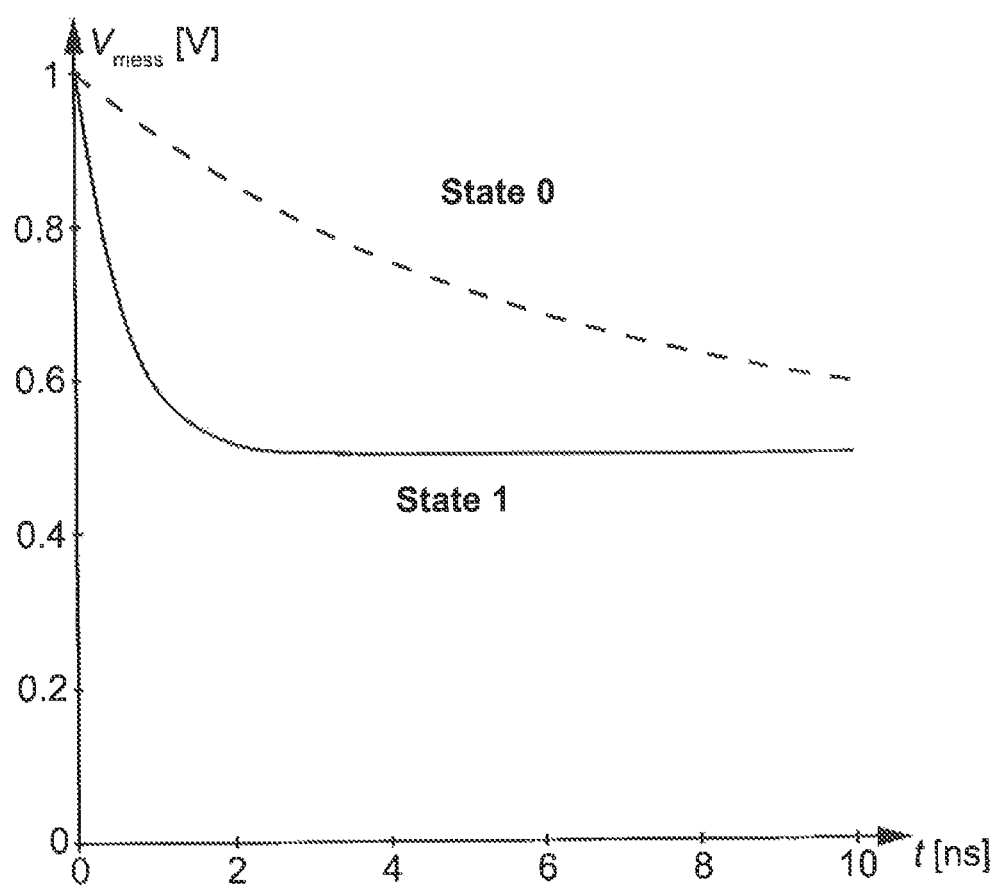
FIG. 2: shows the difference in the current responses that is obtained for states 1 and 0 of the memory element shown in FIGS. 1a and 1b.

FIG. 2 shows the current responses for the states of the memory element shown in FIGS. 1a and 1b after a DC voltage has been applied. The voltage $V_{mess}$ dropping across $R_{series}$ over the time t is plotted.

In state 1, the memory cell B is in state B1, so that the high capacitance $C_B$ thereof is not effective. Capacitance $C_A$, which is only one tenth of that, is decisive for the overall capacitance of the memory element. The memory element thus charges accordingly quickly up to a steady state, in which the charge and discharge of the capacitance thereof are in balance.

In state 0, the memory cell A is in state A0, so that only the small capacitance $C_A$ is de facto eliminated. The large capacitance $C_B$ of memory cell B. however, is effective. It requires a considerably larger time constant until the steady state has been reached.

Such a measurement can be carried out with any arbitrary value for the voltage that is applied to the memory element. In absolute terms, the voltage can in particular be selected low enough so that none of the memory cells switches to a different state. Reading is then non-destructive.

Figure 3:
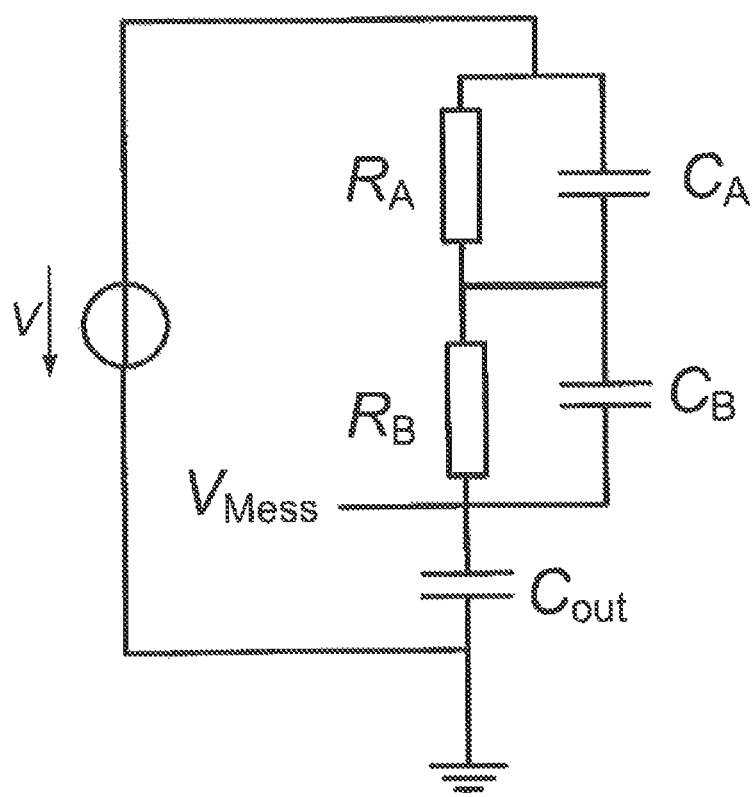
FIG. 3: shows a circuit design for non-destructively reading out a memory element by way of a capacitive voltage divider comprising a further capacitance $C_{out}$.

FIG. 3 shows the circuit design that can be used to read out a memory element comprising two memory cells having differing capacitances by way of a capacitive voltage divider with a further capacitance $C_{out}$. The memory element is shown as the equivalent circuit diagram thereof. The memory cell A here is a parallel circuit of the resistor $R_A$ thereof and the capacitance $C_A$ thereof. Memory cell B is a parallel circuit of the resistor $R_B$ thereof and the capacitance $C_B$ thereof. The two memory cells A and B are connected in series. Contrary to FIG. 1, the memory element here is not connected to ground by way a resistor $R_{series}$, but by way of a further capacitance $C_{out}$, which is composed of the existing capacitances of the circuit design outside the memory element and a potential external capacitance. A DC or AC voltage to ground can be applied by way of point V. The voltage to ground is then measured at point $V_{mess}$.

According to the rules of complex alternating current calculation, the reciprocal AC impedances of $R_A$ and $C_A$ or $R_B$ and $C_B$ add up to the AC impedances of memory cell A or B. The AC impedance of the two memory cells A and B and of the further capacitance $C_{out}$ add up to form the overall impedance of the circuit. This results in the following for the relationship of $V_{mess}$ to V in the steady state $$\frac{V_{mess}}{V} = \frac{1 - \frac{\omega^2 R_A^2 C_A C_{out}}{1-(\omega C_A R_A)^2} - \frac{\omega^2 R_B^2 C_B C_{out}}{1-(\omega C_B R_B)^2} + j\frac{\omega R_A C_{out}}{1-(\omega C_A R_A)^2} + \frac{\omega R_B C_{out}}{1-(\omega C_B R_B)^2}}{\left(1 - \frac{\omega^2 R_A^2 C_A C_{out}}{1-(\omega C_A R_A)^2} - \frac{\omega^2 R_B^2 C_B C_{out}}{1-(\omega C_B R_B)^2}\right)^2 - \left(\frac{\omega R_A C_{out}}{1-(\omega C_A R_A)^2} + \frac{\omega R_B C_{out}}{1-(\omega C_B R_B)^2}\right)^2}$$

If a very high frequency AC voltage is applied and it is taken into consideration that, according to the function of the memory element, one of the two resistances $R_A$ or $R_B$ is always small, above formula in state 1 of the memory element (state combination A0 and B1 of the memory cells) is simplified into $$\frac{V_{mess}}{V} = \frac{1 + \frac{\omega^2 R_A^2 C_A C_{out}}{1-(\omega C_A R_A)^2}}{\left(1 + \frac{\omega^2 R_A^2 C_A C_{out}}{1-(\omega C_A R_A)^2}\right)^2}$$

$$= \frac{1}{1 + \frac{\omega^2 R_A^2 C_A C_{out}}{1-(\omega C_A R_A)^2}}$$

$$= \frac{1}{1 + \frac{C_{out}}{C_A}}$$

$$= \frac{C_A}{C_A + C_{out}}$$

and in state 0 of the memory element (state combination A1 and B0 of the memory cells) it is simplified into $$\frac{V_{mess}}{V} = \frac{1 + \frac{\omega^2 R_B^2 C_B C_{out}}{1-(\omega C_B R_B)^2}}{\left(1 + \frac{\omega^2 R_B^2 C_B C_{out}}{1-(\omega C_B R_B)^2}\right)^2}$$

$$= \frac{1}{1 + \frac{\omega^2 R_B^2 C_B C_{out}}{1-(\omega C_B R_B)^2}}$$

$$= \frac{1}{1 + \frac{C_{out}}{C_B}}$$

$$= \frac{C_B}{C_B + C_{out}}$$

By applying a high-frequency AC voltage, it is possible to reliably distinguish between the two states 0 and 1 of the memory element even if the absolute value of the voltage is not sufficient to switch one of the two memory cells A or B. Unlike with the conventional read process for such memory elements, there is no longer any lower limit for the usable read voltage.

In contrast, if a DC voltage is applied ($\omega$=0), then $V_{mess}$ goes to the operating voltage V in the steady state. While the system is in the transient condition and seeking the state $V_{mess}$=V, the assumption made based on the above derivation that all voltages and currents are sinusoidal is violated. The time characteristic of the transient effect, and thus also of the relationship $V_{mess}$/V after activation of the DC voltage, can be calculated by converting Kirchhoff's Laws that were applied to the circuit design into a differential equation for $V_{mess}$. Alternatively, the time characteristic during activation can, approximately, be regarded as an aperiodic signal, which can be broken down into an infinite number of Fourier components, of which the high-frequency ones satisfy the above equations.

As a result, $V_{mess}$ differs from V for a brief period after a DC voltage has been applied, which can be utilized to read out the state of the memory element.

Figure 4:
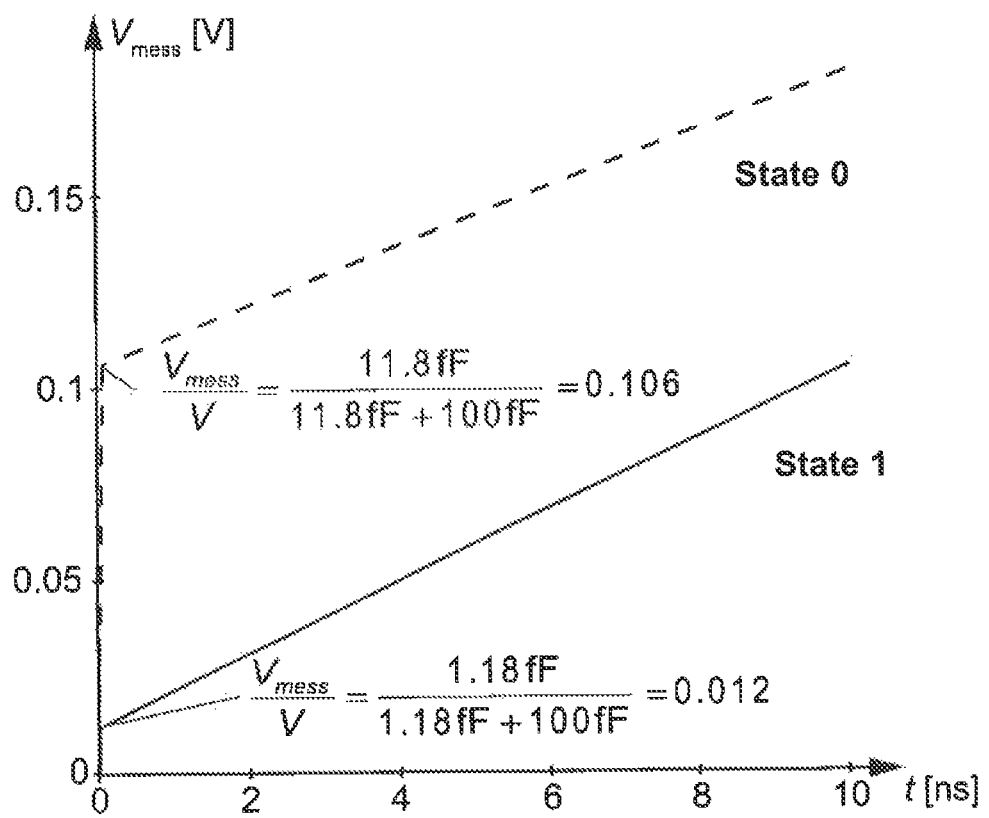
FIG. 4: shows the time characteristic of the voltage $V_{mess}$ measured in the circuit design of FIG. 3 for states 0 and 1 of the memory element within the first 10 ns after the DC voltage has been applied.

FIG. 4 shows the time characteristic of the voltage $V_{mess}$ measured in the circuit design of FIG. 3 for states 0 and 1 of the memory element within the first 10 ns after the DC voltage has been applied. The memory cells have the same capacitances $C_A$ and $C_B$ as in the circuit design shown in FIG. 1. The further capacitance $C_{out}$ is 100 fF.

During the first 10 ns after the DC voltage has been applied, voltages measured for the two states differ from each other by a factor of 8.8, so that these states can be easily distinguished from each other. Because access times in the range of 8 ns are the state of the art in conventional DRAM memory modules, read-out electronics that are able to apply a DC voltage and determine $V_{mess}$ within 10 ns are available in any case.

Figure 5:
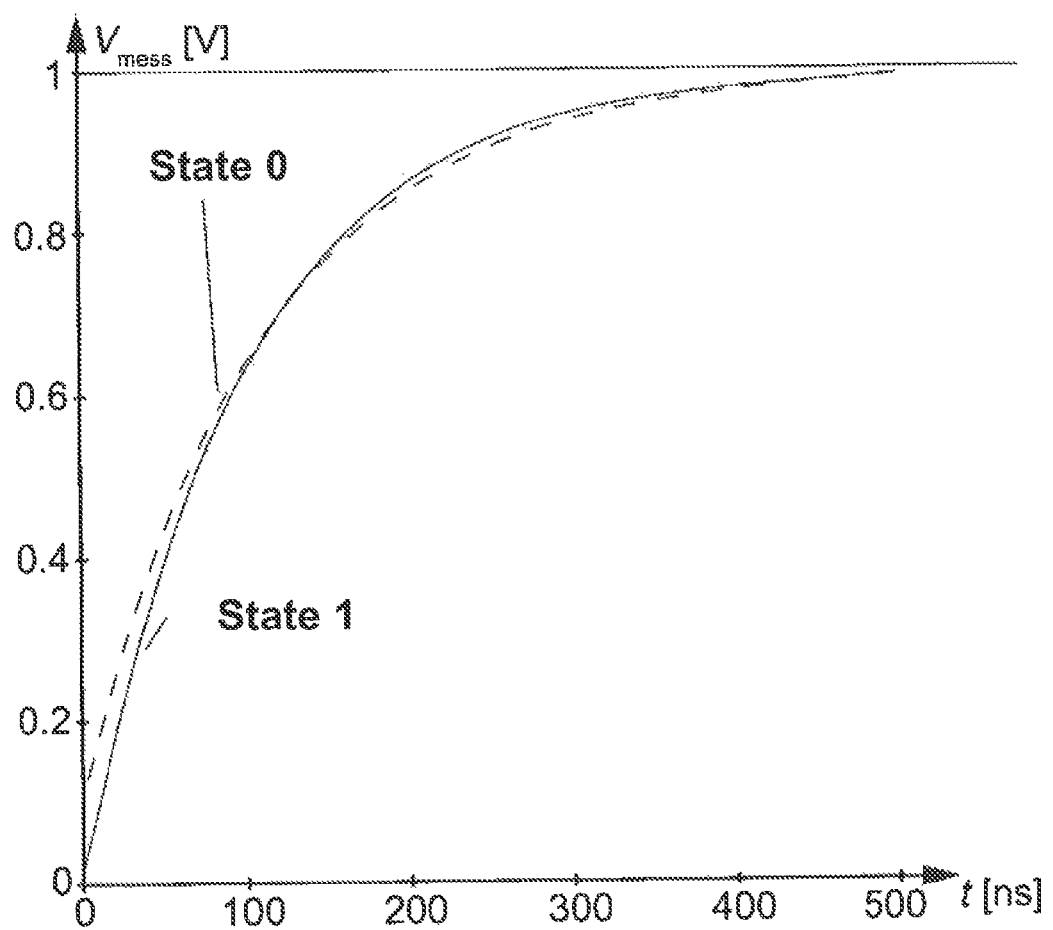
FIG. 5: is an overall representation of the characteristic of $V_{mess}$ in the circuit design of FIG. 3 between when the DC voltage has been applied and the end of the transient effect.

FIG. 5 shows the further time characteristic of the voltage $V_{mess}$ up until 500 ns after application of the DC voltage. The system has almost reached the steady state at this time; the voltage $V_{mess}$ seeks the supply voltage for both states 0 and 1 of the memory element. The transient effect is characterized in that, up until approximately 120 ns after application of the DC voltage, the difference in the voltage $V_{mess}$ between the two states 0 and 1 steadily decreases and then forms again with a change of signs. However, the difference is then much less pronounced than in the first 10 ns after application of the DC voltage, even at the local maximum thereof at approximately 250 ns. Beyond this local maximum, the difference steadily decreases again before completely disappearing at the end of the transient effect.

The time characteristics of $V_{mess}$ were simulated in each case using SPICE software.

In an array comprising many memory elements, the parasitic capacitances of non-addressed memory elements must additionally be considered. The magnitudes of these parasitic capacitances and the distributions thereof within the array depend on the bit pattern that is stored in the array. As a result, the time that is available for the read-out is also dependent on the bit pattern. In the technical implementation of the array, the time period between applying the DC voltage and measuring $V_{mess}$ is therefore dependent on the least favorable conceivable bit pattern.

The inventiom claimed is:

1. A method for reading out a memory element, which comprises a series connection of at least two memory cells A and B, each having a stable state A0 or B0 having higher resistance and a stable state A1 or B1 having lower electrical resistance, state 0 of the memory element being coded in the combination of states A1 and B0 and state 1 of the memory element being coded in the combination of states A0 and B1, by measuring an electrical variable of the series circuit, comprising selecting an electrical variable to which the memory cell A in state A0 makes a different contribution than the memory cell B in state B0 and/or to which the memory cell A in state A1 makes a different contribution than the memory cell B in state B1.

2. The method according to claim 1, wherein none of the memory cells is switched to a different state during the read-out.

3. The method according to claim 1, wherein a voltage generated by the memory element is selected as the electrical variable.

4. A method according to claim 1, wherein the capacitance of the memory element is selected as the electrical variable.

5. The method according to claim 4, wherein the time constant with which the capacitance is charged or discharged is evaluated.

6. The method according to claim 4, wherein the time characteristic of the current that is driven through the memory element after a DC voltage has been applied is measured.

7. A method according to claim 4, wherein the time characteristic of the potential is measured, which is present between the memory element and a further capacitance after a DC voltage has been applied to a series circuit comprising the memory element and the further capacitance.

8. A method according to claim 4, wherein the drop of an AC voltage across the memory element is measured.

9. A memory element having at least one first stable state 0 and a second stable state 1, which can be transferred into state 0 by the application of a first write voltage $V_0$ and into state 1 by the application of a second write voltage $V_1$, the two states 0 and 1 being manifested in differing electrical resistance values of the memory element when a read-out voltage $V_R$ is applied, the absolute value of which is smaller than the write voltages $V_0$ and $V_1$, the memory element comprising a series connection of at least two memory cells A and B, which have a respective stable state A0 or B0 having higher electrical resistance and a stable state A1 or B1 having lower electrical resistance, wherein the capacitances of the memory cells A and B differ by at least 10% from each other in the state combination A0 and B0 and/or in the state combination A1 and B1.

10. The memory element according to claim 9, wherein the memory element is designed as a stack comprising a first metallic electrode, a first layer of active material having variable electrical resistance, a second metallic electrode, a further layer of active material having variable electrical resistance, and a third metallic electrode.

11. The memory element according to claim 10, wherein the thicknesses of the two layers of active material differ by a factor of at least 1.1.

12. The memory element according to claim 10, wherein the relative permittivities of the two layers of active material differ by a factor of at least 1.1.

* * * * *